(12) United States Patent
Nahas et al.

(10) Patent No.: US 8,184,476 B2
(45) Date of Patent: May 22, 2012

(54) RANDOM ACCESS MEMORY ARCHITECTURE INCLUDING MIDPOINT REFERENCE

(75) Inventors: Joseph J Nahas, Austin, TX (US);
Thomas W Andre, Austin, TX (US);
Chitra K Subramanian, Mahopac, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 669 days.

(21) Appl. No.: 12/344,339

(22) Filed: Dec. 26, 2008

(65) Prior Publication Data

US 2010/0165710 A1    Jul. 1, 2010

(51) Int. Cl.
*G11C 11/00* (2006.01)

(52) U.S. Cl. .......................................... 365/158; 365/171
(58) Field of Classification Search .................. 365/158, 365/171, 189.09
See application file for complete search history.

(56) References Cited

U.S. PATENT DOCUMENTS

| | | | |
|---|---|---|---|
| 5,695,864 | A | 12/1997 | Slonczewski |
| 5,764,567 | A | 6/1998 | Parkin |
| 6,445,612 | B1 | 9/2002 | Naji |
| 6,544,801 | B1 | 4/2003 | Slaughter et al. |
| 6,600,690 | B1 | 7/2003 | Nahas et al. |
| 6,778,426 | B2 | 8/2004 | Hosotani |
| 7,088,609 | B2 | 8/2006 | Valet |
| 7,241,631 | B2 | 7/2007 | Huai et al. |
| 7,733,729 | B2 * | 6/2010 | Boeve .................... 365/210.1 |
| 2006/0215446 | A1 | 9/2006 | Hong et al. |

OTHER PUBLICATIONS

International Preliminary Report on Patentability issued Jul. 7, 2011 in PCT/US2009/066405.
Mancoff, F.B., et al. "Angular Dependence of Spin-Transfer Switching in a Magnetic Nanostructure". Applied Physics Letters, Aug. 25, 2003. 1596-98. vol. 83, No. 8. American Institute of Physics.
Slonczewski, J.C. "Current-Driven Excitation of Magnetic Multilayers". Journal of Magnetism and Magnetic Materials. Jun. 1996. L1-L7. vol. 159, Issue 1-2. Elsevier Science B.V.
PCT International Search Report for PCT/US2009/66405 mailed Jan. 26, 2010.

* cited by examiner

*Primary Examiner* — Vu Le
(74) *Attorney, Agent, or Firm* — Ingrassia Fisher & Lorenz, P.C.

(57) ABSTRACT

A random access memory architecture includes a first series connected pair of memory elements (202, 206, 302, 306, 402, 404) having a first resistance and a second series connected pair of memory elements (204, 208, 304, 308, 406, 408) having a second resistance coupled in parallel with the first series connected pair of memory elements, wherein a current flows in the first direction through both of the first and second series connected pair of memory elements. A sense amplifier (14) is coupled to an array (16) of MRAM cells (77), each including a memory element, and includes a voltage bias portion (12), the voltage bias portion including the first and second series connected pair of memory elements. The memory elements may be, for example, magnetic tunnel junctions.

20 Claims, 4 Drawing Sheets

RANDOM ACCESS MEMORY ARCHITECTURE INCLUDING MIDPOINT REFERENCE

FIELD

The present invention generally relates to Magnetic Random Access Memory (MRAM) architecture and more particularly to a circuit for setting of bits in a Magnetic Tunnel Junction (MTJ) reference bit structure.

BACKGROUND

Thin film Magnetoresistive Random Access Memory (MRAM), which includes a Magnetic Tunneling Junction (MTJ) cell, can be fabricated in a variety of memory cell embodiments. The MTJ cell essentially includes a pair of magnetic layers with an insulating layer sandwiched therebetween. One of the magnetic layers has a fixed magnetic vector and the other magnetic layer has a changeable magnetic vector that is stable when either aligned with or opposed to the fixed magnetic vector. When the magnetic vectors are aligned, the resistance of the MTJ cell, i.e. the resistance to current flow between the magnetic layers, is a minimum, Rmin, and when the magnetic vectors are opposed or misaligned the resistance of the MTJ cell is a maximum, Rmax. The value change of this resistance may be on the order of thirty percent. Therefore, for a low resistance value of 10K ohms, the high resistance value could be about 13K ohms. A sense amplifier for an MRAM needs to detect this difference in value. Since the nominal value of the resistance has variation due to processing, it is useful to detect the state of a bit by comparing the resistance of the tunnel junction in a bit to a nearby midpoint reference (the averages of the maximum and minimum conductances) that may be formed as a midpoint of a reference bit in the high resistance state and a reference bit in the low resistance state. It is also important to maintain symmetry to balance the loading from the parasitic resistance and capacitance of the bit lines and the column multiplexing.

U.S. Pat. No. 6,445,612, entitled "MRAM with Midpoint Generator Reference and Method for Readout" and assigned to the Assignee of the present invention, offers one approach to reading data stored in MTJ cells, wherein a reference column including a midpoint generator are positioned adjacent a data column. Memory cells of the data column and the midpoint generator include similar magnetoresistive memory elements (MTJ elements). The MTJ elements of the midpoint generator are each set to one of Rmax and Rmin and connected together to provide a net resistance at a point therebetween. A differential read-out circuit is coupled to the data column and the reference column for differentially comparing a data resistance to a reference resistance. The configuration of MTJ elements in the midpoint generator divides the voltage applied to the reference column such that each MTJ has a reduced voltage applied across the insulating layer compared to MTJ elements on the data column. Since MTJ elements are susceptible to time dependent dielectric breakdown (TDDB) of the insulating layer and TDDB has a strong acceleration with applied voltage, this reduction in voltage applied to the MTJ elements on the reference column increases the amount of time they can be biased for a given level of reliability. In this application, and others using MTJ elements to approximate a midpoint reference, the time that bias is applied to the midpoint reference can be many times more than the time applied to MTJ elements on data columns because the midpoint reference is used during many or all of memory accesses while each MTJ on data columns are typically biased during a small fraction of all memory accesses. Because of this, use of the MTJ configuration in the midpoint generator increases the overall reliability of an MRAM.

Most known sense amplifiers have output terminals that are very responsive to movement on the input nodes of the sense amplifier. This responsiveness causes swings on the output nodes as the input nodes are charged to their steady state levels. During swings in voltage, capacitive imbalance may dominate the transient signal, resulting in loss of differential signal and speed of operation.

U.S. Pat. No. 6,600,690, entitled "Sense Amplifier for a Memory having at least Two Distinct Resistance States" and assigned to the same Assignee as the present invention, provides a fast and efficient read operation of the memory bit cell, wherein a bias circuit applies voltages to a sense amplifier and the sense amplifier develops an average reference current from a reference high bit and a reference low bit with which a differential signal develops in comparison with a bit cell current. Within the sense amplifier, careful distribution of the capacitive load allows for equal capacitive loading on the bit and reference signals, thus optimizing the differential signal. Effective precharge and equalization incorporated into the sense amplifier minimizes the effect of parasitic capacitive imbalances and further improves the speed of operation. The bias circuit, which may be common to multiple sense amplifiers, must include a midpoint reference closely matched to the midpoint conductance of the reference bits connected to the sense amplifier to provide voltages to the sense amplifier that allow maximum speed of operation. Mismatch between the midpoint reference used in the bias circuit and the midpoint conductance of the reference bits connected to the sense amplifier will cause precharge to non-optimal levels and increase the common mode movement on the output terminals of the sense amplifier, causing speed degradation. Therefore, it is best for maximum speed of operation to be able to set the state of each MTJ element in the midpoint reference used in the bias circuit.

When the MTJ elements in an MRAM are "Toggle" MRAM elements, meaning that they are designed to be switched using the Toggle MRAM switching method described in U.S. Pat. No. 6,545,906, no reliable direct write method exists. To set the state of MTJ elements in a midpoint reference, a self referencing method, like that outlined in U.S. Pat. No. 6,760,266 is necessary. Therefore, in order to set the state of each MTJ element in the midpoint reference, it is preferred that each of the MTJ elements can be isolated and independently biased by the circuit performing the self referencing write sequence.

Accordingly, it is desirable to use an MTJ configuration in a midpoint reference for an MRAM sense amplifier bias circuit that has a reduced voltage applied across each MTJ element and in which each MTJ can be set to a desired state, which for "Toggle" MRAM requires that each MTJ element can be isolated for individual biasing. Furthermore, other desirable features and characteristics of the present invention will become apparent from the subsequent detailed description and the appended claims, taken in conjunction with the accompanying drawings and this background.

BRIEF DESCRIPTION OF THE DRAWINGS

Embodiments of the present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

It is desirable for a midpoint reference to present a conductance that is at the midpoint of a single MTJ in either the high or low resistance state. It is further desirable for a midpoint reference to be biased at a low potential to extend the TDDB lifetime in cases where the midpoint reference is biased constantly or at a high duty cycle. Configuring multiple MTJ elements to accomplish the preferred midpoint reference typically requires series arrangements that prevent read access to each MTJ element individually. When "Toggle" MTJ elements are used, read access to each MTJ element is desirable to set the state of each MTJ element, which is necessary to achieve the optimal midpoint reference. It is also preferred that the resistance added by transistors included in the midpoint reference be similar to the resistance added by similar transistors used to access MTJ elements in the MRAM data array, and that the direction of current flow through the MTJ elements in the midpoint reference be the same direction as current flows through MTJ elements in the MRAM data array. The exemplary embodiments of an MRAM midpoint reference described herein overcome these problems found in previously known midpoint generator.

Figure 2:
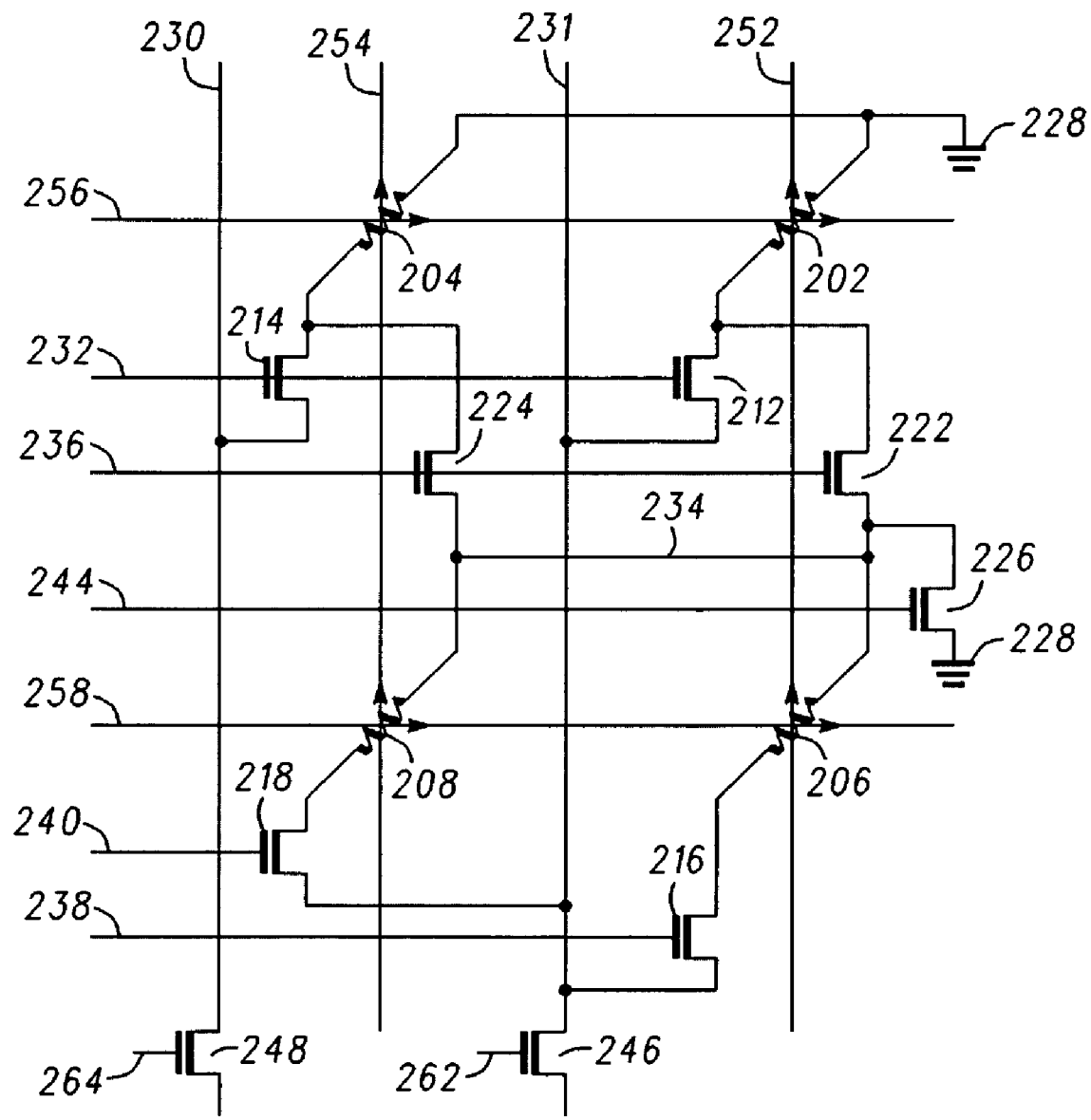
FIG. 2 is a schematic diagram of a mid-point reference in accordance with a first exemplary embodiment.
Figure 3:
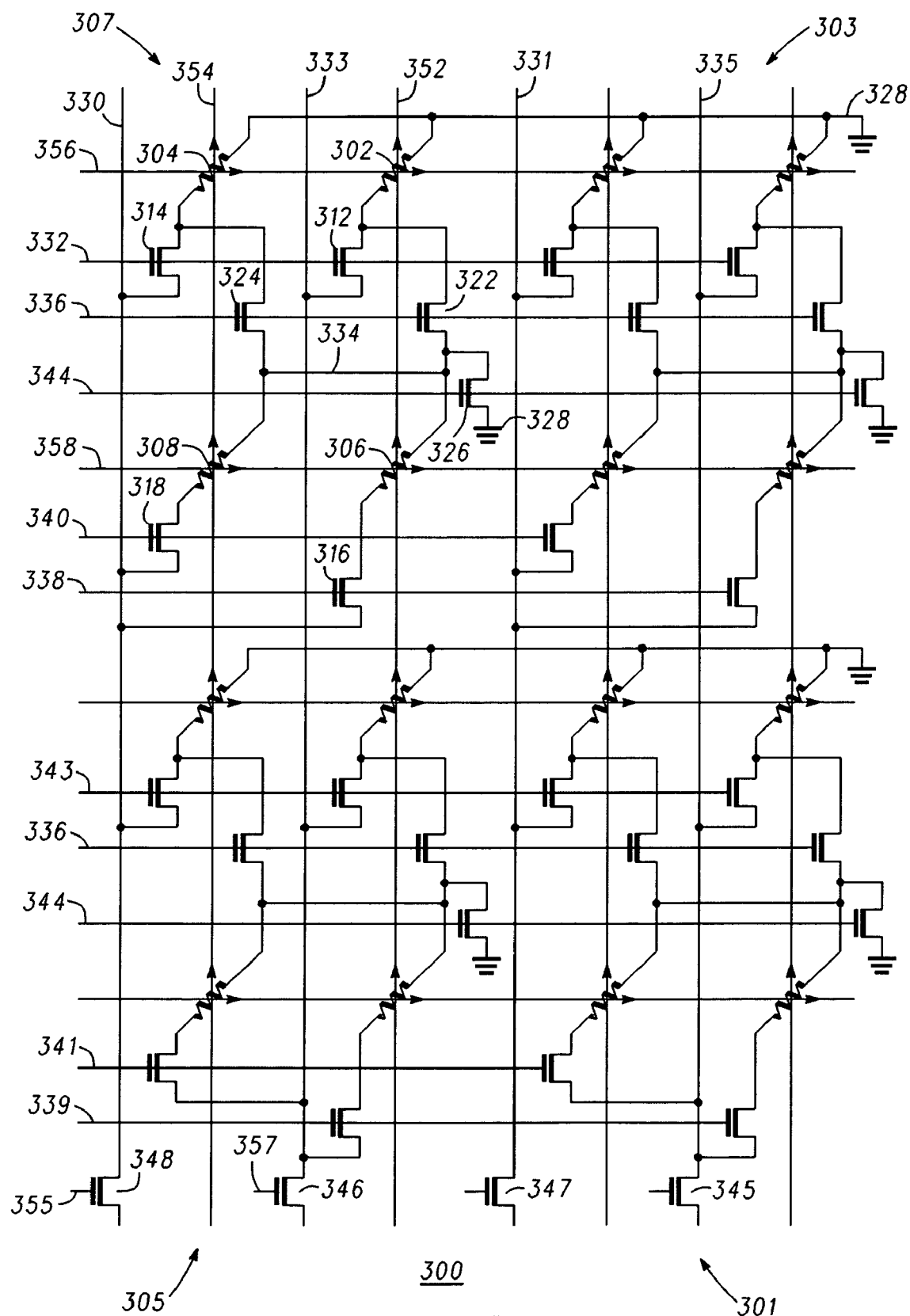
FIG. 3 is a schematic diagram of a mid-point reference in accordance with a second exemplary embodiment.
Figure 4:
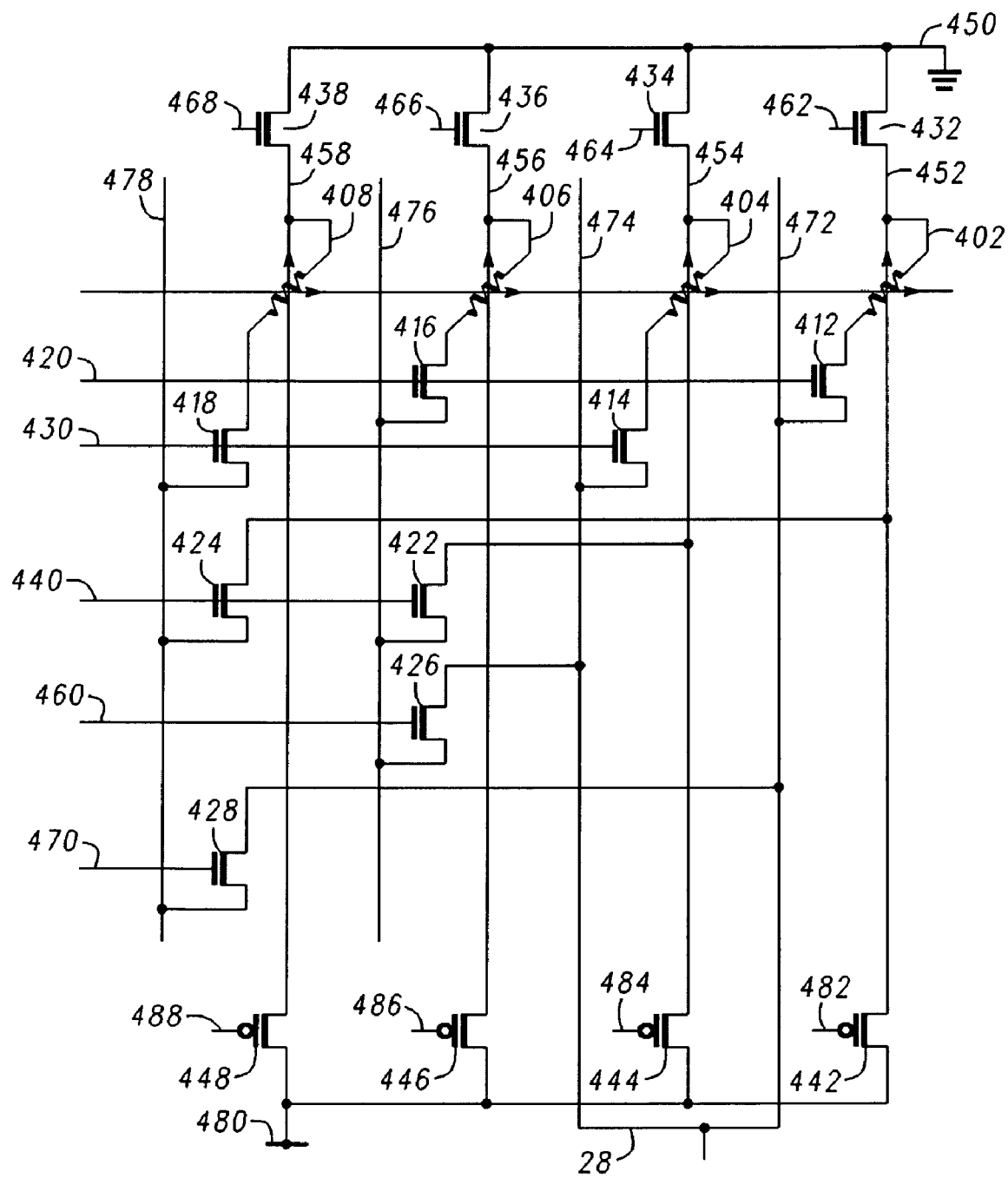
FIG. 4 is a schematic diagram of a mid-point reference in accordance with a third exemplary embodiment.

The first and second exemplary embodiments of FIGS. 2 and 3 respectively require an MRAM process providing a means of connecting the upper terminals of the different MTJ elements independent of the write lines, such as metal local interconnect above the tunnel junctions while the third exemplary embodiment of FIG. 4 enables use of a process where the write lines are connected directly to the upper terminal of each MTJ.

The magnetoresistive random access memory (MRAM) midpoint reference described herein includes four magnetic tunnel junction (MTJ) devices incorporated within transistor circuitry wherein a current is steered in one direction through a first series connected pair of the MTJs and in the same direction through a second series connected pair of the MTJs in parallel with the first series connected pair of the MTJs. A midpoint conductance is provided for each of the MTJs in the array by preventing an access transistor from adding significant resistance thereto. The current flows in the same direction through all MTJs in the structure and in the same direction as the sense current in the array to prevent the non-linear and non-symmetric MTJ from affecting the output. The midpoint reference accurately assesses the state of a single MTJ in a plurality of MTJs to set the state of the MTJ.

Figure 1:
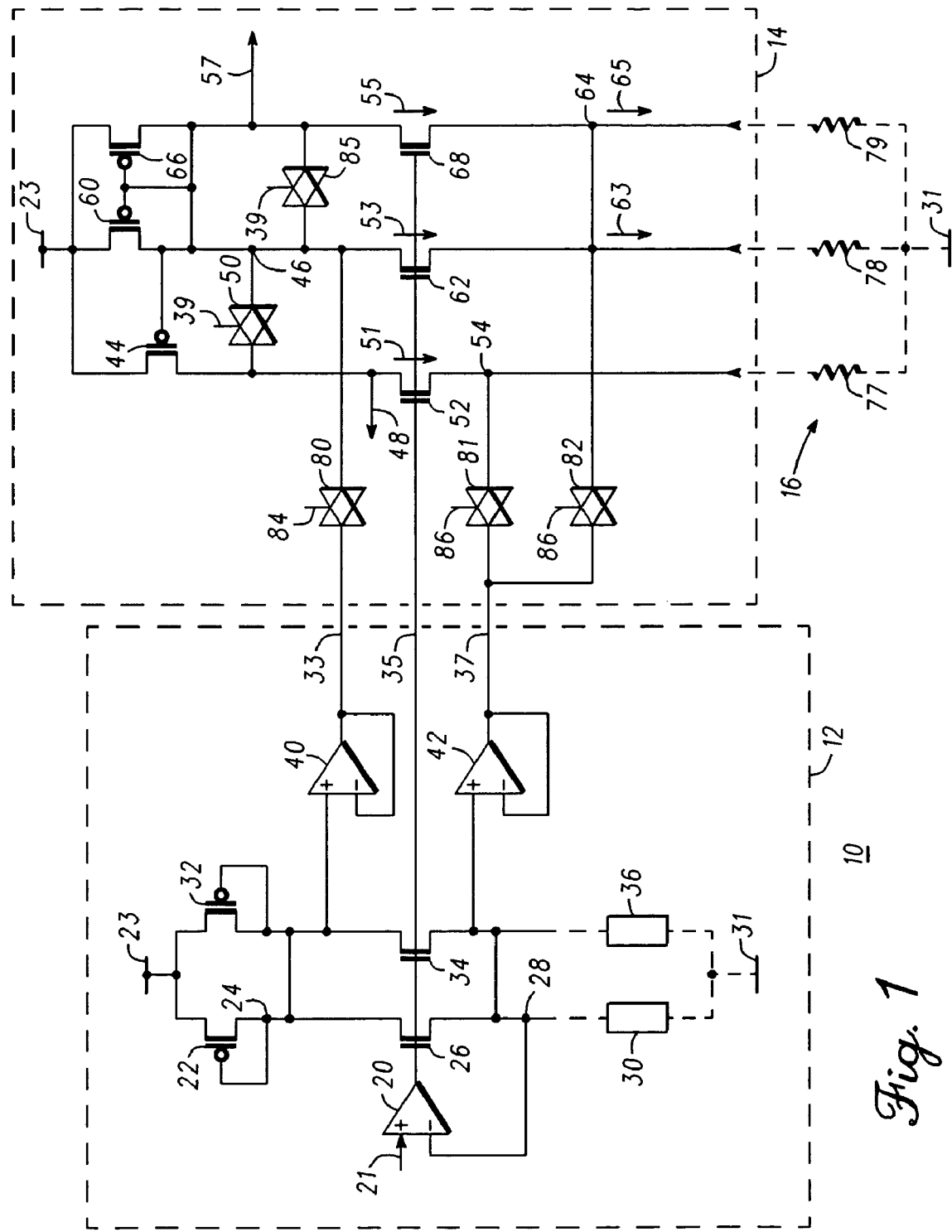
FIG. 1 is a schematic diagram of a sense amplifier with a bias circuit including a mid-point reference in accordance with the exemplary embodiments.

The memory sense amplifier for a memory having at least two distinct resistance states shown in FIG. 1 includes a memory 10 having a voltage bias portion 12, a sense amplifier 14 and an array portion 16. While the exemplary embodiments described herein describe MRAM architectures, the invention may also apply to any resistive memory. The voltage bias portion 12 has a P-channel transistor 22 having a first current electrode or a source connected to a power supply voltage terminal 23. A control electrode or gate of transistor 22 is connected to a second current electrode or a drain thereof at a node 24. An N-channel transistor 26 has a drain connected to the drain of transistor 22, a gate connected to the output of an operational amplifier 20, and a source connected to a node 28. Operational amplifier 20 has a first or positive (non-inverting) input connected to a reference voltage 21. A second or negative (inverting) input of operational amplifier 20 is connected to node 28. A P-channel transistor 32 has a source connected to the 23 terminal, and a gate and a drain connected together and to node 24. An N-channel transistor 34 has a drain connected to node 24, a gate connected to the output of operational amplifier 20, and a source coupled to node 28. In accordance with the exemplary embodiments described herein, midpoint references 30 and 36 are coupled between node 28 and a source voltage 31. An operational amplifier 40 has a positive input connected to the gate and drain of transistor 32, a negative input connected to an output thereof for providing a sense precharge voltage 33. An operational amplifier 42 has a positive input connected to the source of transistor 34, and a negative input connected to an output thereof for providing a bit precharge voltage 37. The output of operational amplifier 20 provides a common gate bias voltage 35.

In the sense amplifier 14, a P-channel transistor 44 has a source connected to the voltage terminal 23. A drain of transistor 44 is connected to a drain of an N-channel transistor 52 at an output node 48. A gate of transistor 52 is connected to the bias voltage 35. A source of transistor 52 is connected to a node 54 and coupled via one or more coupling devices (not shown) to a first terminal of a bit resistance 77 having a resistance of $R_B$. A second terminal of bit resistance 77 is coupled via one or more coupling devices (not shown) to the voltage terminal 31. A P-channel transistor 60 has a source connected to the 23 voltage terminal, and a gate connected to a drain thereof and to a gate of transistor 44. A switch 50 has a first terminal connected to the drain of transistor 44 and a second terminal connected to the drain of transistor 60 at node 46. Switch 50 is controlled by an Equalization control signal 39. A drain of an N-channel transistor 62 is connected to node 46. Transistor 62 has a gate connected to the common gate bias voltage 35 and has a source connected to a node 64. A first terminal of a high reference resistance 78, is coupled via one or more coupling devices (not shown) to node 64. A second terminal of resistance 78 is coupled via one or more coupling devices (not shown) to the voltage terminal 31. A P-channel transistor 66 has a source connected to the voltage terminal 23. A gate of transistor 66 is connected to the gate of transistor 60. A drain of transistor 66 is connected to a reference output terminal 57. A drain of an N-channel transistor 68 is connected to node 57. Transistor 68 has a gate connected to the common gate bias voltage 35. A source of transistor 68 is connected to node 64 and coupled via one or more coupling devices (not shown) to a first terminal of a low reference resistance 79. A second terminal of resistance 79 is coupled via one or more coupling devices (not shown) to the voltage terminal 31. A switch 80 has a first terminal connected to the output of operational amplifier 40, node 33. Switch 80 has a second terminal connected to node 46, and has a control terminal connected to a precharge control signal 84. A switch 85 has a first terminal connected to node 46. Switch 85 has a second terminal connected to node 57, and has a control terminal connected to the equalization control signal 39. A switch 81 has a first terminal connected to the output node 37 of operational amplifier 42, a second terminal connected to node 54 and a control terminal for receiving a precharge control signal 86. A switch 82 has a first terminal connected to the output of operational amplifier 42, node 37, a second terminal connected to node 64, and a control terminal for receiving the precharge control signal 86.

In operation, sense amplifier 14 senses a state of a memory cell, represented by resistance 77 that is programmable to either a high state or a low state. A bit (B), a high reference (H) and a low reference (L) are accessed in sense amplifier 14 by an address and a decoder (not shown). For memories such as an MRAM, the high reference is a cell programmed to a distinct high resistance memory state, $R_{H2}$ as represented by resistance 78. Similarly, the low reference is a cell programmed to a distinct low resistance memory state, $R_{L2}$ as represented by resistance 79. The bit is an addressed cell whose memory state $R_B$ represented by resistance 77 and could be either a high (represented by a high resistance state) or a low (represented by a low resistance state). It should be appreciated that pass transistors (not shown) may exist between each of transistors 52, 62 and 68 and the associated coupled memory cell so that the resistances 77, 78 and 79 each represent a cumulative resistance associated with accessing the associated memory cell. Similarly, pass transistors may exist between the resistances 77, 78 and 79 and the voltage terminal 31.

Bias circuit 12 will generate three specific bias voltages to control sense amplifier 14. Sense amplifier 14 uses a common gate voltage 35, to bias the transistors 52, 62 and 68. The biasing of transistors 52, 62 and 68 places a substantially same bias voltage across resistances 77, 78, and 79 that is close to a transistor threshold below 35. This biasing establishes saturated current levels for each of transistors 52, 62 and 68 that is represented as currents 51, 53, and 55. The values of 51, 53 and 55 are close to the substantially same bias voltage placed across them divided by the total effective resistance associated with accessing 77, 78 and 79. In the illustrated form, transistors 62 and 68 are connected in a manner that averages currents 63 ($I_H$) and 65 ($I_L$) thereby establishing a current, 53 and 55 respectively, through each of transistors 62 and 68 equal to ($I_H + I_L$)/(2). Connecting the gate of transistor 44 at node 46 to the gate and drain of transistor 60 establishes as a current mirror a saturated current level for transistor 44 that is also equal to ($I_H + I_L$)/(2). Connecting the gate of transistor 66 at node 46 to the gate and drain of transistor 60 establishes as a current mirror a saturated current level for transistor 66 that is also equal to ($I_H + I_L$)/(2). The voltage at node 57 will reflect the difference between the nominally identical currents (IH+IL)/(2) conducted by transistors 66 and 68. The voltage at node 57 establishes a reference voltage. The output voltage at node 48 will then reflect the difference between the saturated current ($I_H + I_L$)/(2) conducted by transistor 44 and the saturated current 51 conducted by transistor 52. For a resistance 77 with a low resistance state, the steady state voltage value of the signal at node 48 will be lower in potential than the reference voltage 57. For a resistance 77 with a high resistance state, the steady state voltage value of the signal 48 will be higher in potential than the reference voltage 57.

Use of precharge and equalization techniques enhances the speed of sense amplifier 14. By using precharge switches 80-82 in conjunction with equalization switches 50 and 85, the time required to charge capacitance associated with nodes 54, 64, 57, 48 and 46 is significantly reduced. By maintaining equalization switches 50 and 85 conductive after precharge switch 80 is made nonconductive by the precharge signal 84, nodes 46 and 48 are held at equal potential to reach their steady state potentials and diminish the effect of capacitive imbalances associated with the circuitry.

Voltage bias portion 12 receives a reference input voltage 21, and uses midpoint references 30 and 36 to provide precharge and bias voltages to sense amplifier 14. In operation, voltage 35 is controlled by operational amplifier 20 to maintain a voltage equal to the reference voltage 21 input voltage on node 28. The two midpoint references 30 and 36, are coupled to node 28. The connection of reference cells 30 and 36 with the inverting input of operational amplifier 20 along with transistors 26 and 34 being sized substantially equal to the size of transistors 52, 62 and 68 results in the establishment of a voltage 35 that creates steady state voltages in sense amplifier 14 that are substantially equal to the reference voltage 21. In particular, the steady state voltages are the voltages at nodes 54 and 64.

The voltage 37 provided by operational amplifier 42 is used to precharge nodes 54 and 64 to a value close to their steady state values. By using transistors 22 and 32 substantially of the same size as transistors 44, 60 and 66, operational amplifier 40 provides a voltage 33 that is used to precharge nodes 48 and 46 in sense amplifier 14 to a value close to their steady state value.

In operation, voltage bias portion 12 midpoint references 30 and 36 are continuously biased while sense amplifier 14 reference memory cells 78 and 79 are biased only during sensing operations. Because of the continuous bias, the time dependent dielectric breakdown (TDDB) could cause shifts in the characteristics of reference cells 30 and 36 relative to the resistance characteristics of reference memory cells 78 and 79. The placement of reference memory cells 30 and 36 (midpoint references) with significantly reduced voltage across the magnetic tunnel junctions substantially improves the reliability of voltage bias portion 12.

Bias portion 12 is designed to adjust the voltages 33, 35, and 37 over temperature, supply voltage, and process variations. The tracking in voltage values between bias portion 12 and sense amplifier 14 is in part due to the intentional device size matching of transistors in voltage bias portion 12 with transistors in sense amplifier 14 and use of reference midpoint references 30 and 36. Although the midpoint references described below are illustrated for use with a voltage bias reference 12 and the sense amplifier 14, it should be understood that the midpoint references may be used in other applications.

In accordance with a first exemplary embodiment (FIG. 2), a mid-point reference 200 that is positioned in the voltage bias portion 12 of FIG. 1 at blocks 30 and 36, includes MTJs 202, 204, 206, 208, control transistors 212, 214, 216, 218, and reference transistors 222, 224, 226. First sides of the MTJs 202, 204 are connected to a reference voltage 228 such as ground, while second sides are connected to the sources of control transistors 212 and 214, respectively, and the sources of reference transistors 222 and 224, respectively. Control transistors 212 and 214 have their drains connected to read bit line 231 and a read bit line 230, respectively, and their gates coupled to a read word line 232. First sides of the MTJs 206, 208 are connected together to the drains of reference transistors 222, 224 at node 234. Reference transistors 222, 224 have their gates coupled to a read reference line 236. Control transistors 216, 218 have their sources connected to second sides of MTJs 206, 208, respectively, drains coupled to read bit line 231, and their gates connected to read word lines 238, 240, respectively. The third reference transistor 226 has a drain connected to the drain of reference transistor 222, a gate connected to an inverted read reference line 244, and a source coupled to the reference voltage 228. Select transistors 246, 248 have sources connected to read bit line 231 and the read bit line 230, respectively, enabling access from either the bias circuit 12 of FIG. 1 or from a sense amplifier used to read the state of each MTJ, and a gate connected to column select lines 262 and 264, respectively. A first write bit line 252 is disposed near the MTJs 202, 206 and a second write bit line 254 is disposed near the MTJs 204, 208. A first write word line 256 is disposed near the MTJs 202, 204 and a second write word line 258 is disposed near the MTJs 206, 208.

This first exemplary embodiment described above can be used where the read and write paths for the MTJs 202, 204, 206, 208 are fully isolated, for example, when using a local interconnect above the tunnel junction 202, 204, 206, 208 and below the write bit lines 252, 254. When in use as a midpoint reference, read word line 232 is not asserted resulting in transistors 212, 214 being off. The read reference signal line 236 is asserted and its inverse, inverted read reference line 244 is not asserted, thereby connecting the upper two tunnel junctions 202, 204 to the lower two tunnel junctions 206, 208 through transistors 222, 224. Asserting read word lines 238, 240 connects the bottom two tunnel junctions 206, 208 to read bit line 231. Asserting column select line 262 connects this bit line to the voltage bias portion 12 (FIG. 1) at node 28 through connections not shown. If the voltage bias portion 12 applies a voltage to node 28, then current flows through the series connection of transistor 218, MTJ 208, and in parallel through the series connection of transistor 216, and MTJ 206, to node 234. From node 234, current flows through the series connection of transistor 224, MTJ 204, and in parallel through the series connection of transistor 212, and MTJ 202 to ground. Note this arrangement is a parallel/series combination of four series transistors and MTJs and that current travels in the same direction through all of the MTJs while providing a midpoint reference if the resistance states of the MTJs is set appropriately.

If the read reference signal 236 is not asserted and its inverse inverted read reference signal 244 is asserted, then the upper two MTJs 202, 204 are disconnected from the lower two MTJs 206, 208 which are connected to ground through transistor 226. If the read word line 232 is asserted, then MTJ 202 is connected to read bit line 231 and MTJ 204 is connected to read bit line 230. Asserting column select 262 connects read bit line 231 and MTJ 202 to the sense amplifier (not shown) enabling the reading of MTJ 202 as a normal MTJ. Asserting column select 264 connects read bit line 230 to the sense amplifier (not shown) enabling the reading of the MTJ 204. Likewise, if read word line 238 is asserted, MTJ 206 is connected to read bit line 231 enabling the sensing of MTJ 206, and if read word line 240 is asserted, MTJ 208 is connected to read bit line 231 enabling the sensing of MTJ 208. Thus, the state of each of the four MTJs 202, 204, 206, 208 are separately sensed and can be set to a desired state.

Furthermore, since each of the bits may be set individually, the ratio of the bits in the high resistance state to the bits in the low resistance state can be adjusted to adjust the resultant "midpoint" reference, tuning it to a value that nearly matches the midpoint conductance of the MTJ elements in the array.

Referring to FIG. 3, the circuit 300 of the second exemplary embodiment includes four sets 301, 303, 305, 307 of four MTJs each, wherein each set of four MTJs are similar to that of FIG. 2. One exemplary use of this circuit is for two of the four sets 301, 303, 305, 307 to generate a sense amplifier reference (as in the first exemplary embodiment) and the other two of the four sets 301, 303, 305, 307 are used to generate a stress bias. Set 307 of the four sets will be described for its use as a mid-point reference. This mid-point reference 307 that is positioned in the voltage bias portion 12 of FIG. 1 as one of blocks 30 or 36, includes MTJs 302, 304, 306, 308, control transistors 312, 314, 316, 318, and reference transistors 322, 324, 326. First sides of the MTJs 302, 304 are connected to a reference voltage 328 such as ground, while second sides are connected to the sources of control transistors 312 and 314, respectively, and the sources of reference transistors 322 and 324, respectively. Control transistors 312 and 314 have their drains connected to read bitline 333 and a read bit line 330, respectively, and their gates coupled to a read word line 332. First sides of the MTJs 306, 308 are connected together to the drains of reference transistors 322, 324 at node 334. Reference transistors 322, 324 have their gates coupled to a read reference line 336. Control transistors 316, 318 have their sources connected to second sides of MTJs 306, 308, drains coupled to the read bit line 330, and their gates connected to a second read word lines 338, 340, respectively. The third reference transistor 326 has a drain connected to the node 334, a gate connected to an inverted read reference line 344, and a source coupled to the reference voltage 328. Select transistor 348 has a source connected to the reference bit line 330, a drain enabling access from either the bias circuit 12 of FIG. 1 or from a sense amplifier used to read the state of each MTJ, and a gate connected to column select line 355. Select transistor 346 has a source connected to the reference bit line 333, a drain enabling access from either the bias circuit 12 of FIG. 1 or from a sense amplifier used to read the state of each MTJ, and a gate connected to column select line 357. A first write bit line 352 is disposed near the MTJs 302, 306 and a second write bit line 354 is disposed near the MTJs 304, 308. A first write word line 356 is disposed near the MTJs 302, 304 and a second write word line 358 is disposed near the MTJs 306, 308.

In operation, when the read reference line 336 is asserted and its inverse, inverted read reference line 344 is not asserted, transistors 322 and 324 are activated. Read word lines 338, 340 connect this midpoint reference to the read bit line 330. These same two read word lines 338, 340 connect the set 303 to the read bit line 331. Likewise, read word lines 339, 341 connect the midpoint references 305 and 301 to read bit lines 333 and 335, respectively. Thus, all four midpoint references can be accessed simultaneously while having only double the number of read bit lines as used in the embodiment shown in FIG. 2. When the read reference signal 336 is not asserted and its inverse inverted read reference 344 is asserted, the sixteen individual MTJs can be individually accessed for state setting using read word lines 332, 338, 339, 340, 341, 343, and column select transistors 345, 346, 347, 348.

Referring to FIG. 4, the circuit 400 of the third exemplary embodiment is for use in an MRAM where a local interconnect above the MTJ is not used and the write bit line is used for the top connection to the MTJ and includes four MTJ 402, 404, 406, 408, four control transistors 412, 414, 416, 418, four column select transistors 422, 424, 426, 428, and four column enable transistors 432, 434, 436, 438, and four reference write transistors 442, 444, 446, 448. The column enable transistors 432, 434, 436, 438 have a source connected to a reference voltage 450, such as ground, a drain coupled by write bit lines 452, 454, 456, 458 to a first side of the MTJs 402, 404, 406, 408, respectively, and a gate connect to toggle write lines 462, 464 and standard lines 466, 468, respectively. Control transistors 412, 414, 416, 418 have their sources coupled to the second side of the MTJs 402, 404, 406, 408, respectively, their drains coupled to read bit lines 472, 474, 476, 478, respectively. The gates of control transistors 412, 416 are connected to even read word line 420 and the gates of control transistors 414, 418 are connected to odd read word line 430. The column select transistors 422, 424, 426, 428 have their sources connected to the write bit lines 454, 452, and read bit lines 474, 472, respectively. The column select transistors 422, 424 have their drains connected to read bit lines 476, 478, respectively, and their gates connected to std line 440. The column select transistors 426, 428 have their drains connected to read bit lines 476, 478, respectively, and their gates connected to trd0 line 460 and trd1 line 470, respectively. Reference Write transistors 442, 444, 446, 448 have their drains coupled to write bit lines 452, 454, 456, 458, respectively, their sources coupled to a reference voltage 480, such as $V_{DD}$ 23, and their gates connected to write reference lines 482, 484, 486, 488, respectively. Read bit lines 472, 474 are connected together to create the sense access node 490. Node 490 is coupled to node 28 of FIG. 1 and to a sense amplifier for sensing the state of an MTJ, not shown.

In operation as a midpoint reference, with column enable transistors 436, 438, even read word line 420, odd read word line 430, and standard line 440 asserted and a voltage applied to the sense node 490, current flows through control transistor 412, MTJ 402, column select transistor 424, control transistor 418, MTJ 408, and column enable transistor 438 to ground 450, and likewise, through control transistor 414, MTJ 404, column select transistor 422, control transistor 416, MTJ 406, and column enable transistor 436 to ground 450. Transistors 422, 424, 436, 438 are wide in comparison to transistors 412, 414, 416, 418 so that the resistance of the latter transistors dominates. This architecture of four MTJ and four transistors in series/parallel match the resistance in the MTJs. Since the current flows in the same direction through the MTJs 402, 404, 406, 408, no asymmetry is created.

To sense MTJ 402, both toggle write line 462 and even read word line 420 are asserted to connect the MTJ 402 between sense node 490 and ground 450. To sense MTJ 404, toggle write line 464 and odd read word line 430 are asserted to connect MTJ 402 between sense node 490 and ground 450. To sense MTJ 406, standard line 466, even read word line 420, and trd0 line 460 are asserted to connect MTJ 404 between sense node 490 and ground 450. To sense MTJ 408, standard line 468, odd read word line 430, and trd1 line 470 are asserted to connect MTJ 408 between sense node 490 and ground 450. Thus, each MTJ element can be independently sensed.

Therefore, it is seen that each of the three exemplary embodiments provide a midpoint resistance for each of the MTJs in the array by preventing an access transistor from adding significant resistance thereto. The current flows in the same direction through all MTJs in the structure and in the same direction as the sense current in the array to prevent the non-linear and non-symmetric MTJ from affecting the output. The midpoint reference accurately assesses the state of a single MTJ in a plurality of MTJs to set the state of the MTJ.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A random access memory architecture comprising:
an array of memory cells, each memory cell having a programmable state comprising one of a first resistance state and a second resistance state; and
a midpoint reference coupled between a first node and a second node and having a resistance between that of the first resistance state and the resistance of the second resistance state, comprising:
a first memory element coupled to the first node and having a programmable state comprising one of the first resistance state and the second resistance state;
a second memory element coupled to the second node and having a programmable state comprising one of the first resistance state and the second resistance state coupled to the first memory cell: and
circuitry selectively coupled to either the first or second memory element in order to sense whether the coupled first or second memory element is in the first or second resistance state.

2. The random access memory of claim 1 further comprising:
a third memory element coupled to the first node and having a programmable state comprising one of the first resistance state and the second resistance state; and
a fourth memory element coupled to the second node and having a programmable state comprising one of the first resistance state and the second resistance state coupled to the third memory element;
wherein the circuitry is further selectively coupled to either the third or fourth memory element in order to sense whether the coupled third or fourth memory element is in the first or second resistance state.

3. The random access memory of claim 2 wherein the third memory element is further coupled to the second memory element.

4. The random access memory architecture of claim 1 wherein the first memory element comprises a first series connected pair of memory elements and the second memory element comprises a second series connected pair of memory elements, the random access memory architecture further comprising:
a sense amplifier coupled to the array of memory cells; and
a voltage bias portion coupled to the sense amplifier, the voltage bias portion including the first and second memory elements.

5. The random access memory architecture of claim 1 further comprising:
the array of memory cells comprising at least one data column of memory cells coupled to have information stored within at least one memory cell, each memory cell including at least one non-volatile memory element programmable to one of the first state of resistance and the second state of resistance;
a circuit positioned adjacent the at least one data column, having a net resistance between the first data state and second state states of resistance; and
a differential read-out circuit coupled to the at least one data column for differentially comparing a data current generated from the non-symmetric memory element to a reference current generated from the circuit and providing a data output signal, wherein the differential read-out circuit includes the first and second memory elements.

6. The random access memory architecture of claim 4 wherein the voltage bias circuit comprises:
a first transistor of a first conductivity type having a first current electrode coupled to a first node, a second current electrode coupled to a second node, and a control electrode coupled to a reference voltage;
a second transistor of a second conductivity type having a first current electrode coupled to the second node; a second current electrode coupled to a drain voltage, and a control electrode coupled to the second node;
a third transistor of a first conductivity type having a first current electrode coupled to the first node, a second current electrode coupled to the second node, and a control electrode coupled to the reference voltage; and
a fourth transistor of the second conductivity type having a first current electrode coupled to the second node, a second current electrode coupled to a drain voltage, and a control electrode coupled to the second node;
wherein the first and second memory elements are coupled between the first node and a voltage source.

7. A random access memory architecture comprising:
a plurality of non-symmetric memory elements, each capable of having a first state of resistance and a second state of resistance, wherein the resistance when the current is flowing therethrough in a first direction is not equal to the resistance when the current is flowing therethrough in a second direction;
a first series connected pair of memory elements having a first resistance and a second resistance, respectively, and disposed wherein a current flows in the first direction through both of the first series connected pair of memory elements; and
a second series connected pair of memory elements having a third and a fourth resistance, respectively, coupled in parallel with the first series connected pair of memory elements, and disposed wherein a current flows in the first direction through both of the second series connected pair of memory elements.

8. The random access memory architecture of claim 7 wherein the first series connected pair of memory elements comprises first and second memory elements and the second series connected pair of memory elements comprises third and fourth memory elements, the random access memory architecture further comprising:
a first voltage reference coupled to a first side of the first and third memory elements;
a first transistor coupled between a second side of the first memory element and a first node;
a second transistor coupled between a second side of the third memory element and the first node, the first node being coupled to a first side of both the second and fourth memory elements;
a third transistor coupled between a second side of the second memory element and a first read bit line; and
a fourth transistor coupled between a second side of the fourth memory element and the first read bit line.

9. The random access memory architecture of claim 8 further comprising:
a fifth transistor coupled between the second side of the first memory element and the first read bit line;
a sixth transistor coupled between the second side of the third memory element and a second read bit line; and
a seventh transistor coupled between the first node and the first voltage reference.

10. The random access memory architecture of claim 7 wherein the first series connected pair of memory elements comprises first and second memory elements and the second series connected pair of memory elements comprises third and fourth memory elements, the random access memory architecture further comprising:
a sense amplifier coupled to the plurality of non-symmetric memory elements; and
a voltage bias portion coupled to the sense amplifier, the voltage bias portion including the first and second series connected pair of memory elements.

11. The random access memory architecture of claim 7 further comprising:
the plurality of non-symmetric metric memory elements comprising at least one data column of memory cells coupled to have information stored within a data cell, each memory cell including at least one non-volatile memory element programmable to one of the first state of resistance and the second state of resistance;
a circuit positioned adjacent the at least one data column, having a net resistance between the first data state and second state states of resistance; and
a differential read-out circuit coupled to the at least one data column for differentially comparing a data current generated from the non-symmetric memory element to a reference current generated from the circuit and providing a data output signal, wherein the differential read-out circuit includes the first and second series connected pair of memory elements.

12. The random access memory architecture of claim 10 wherein the voltage bias circuit comprises:
a first transistor of a first conductivity type having a first current electrode coupled to the first node, a second current electrode coupled to a second node, and a control electrode coupled to a reference voltage;
a second transistor of a second conductivity type having a first current electrode coupled to the second node; a second current electrode coupled to a drain voltage, and a control electrode coupled to the second node;
a third transistor of a first conductivity type having a first current electrode coupled to the first node, a second current electrode coupled to the second node, and a control electrode coupled to the reference voltage; and
a fourth transistor of the second conductivity type having a first current electrode coupled to the second node, a second current electrode coupled to a drain voltage, and a control electrode coupled to the second node;
wherein the first and second series connected pair of memory elements are coupled between the first node and a voltage source.

13. The random access memory architecture of claim 9 further comprising:
a third series connected pair of memory elements having a first resistance comprising fifth and sixth memory elements and disposed wherein a current flows in a first direction through both of the third series connected pair of memory element;
a fourth series connected pair of memory elements having a second resistance, coupled in parallel with the third series connected pair of memory elements, comprising seventh and eighth memory elements and disposed wherein a current flows in the first direction through both of the fourth series connected pair of memory elements;
a second current conductor coupled to a first side of the fifth and seventh memory elements;
an eighth transistor coupled between a second side of the fifth memory element and a second node;
a ninth transistor coupled between a second side of the seventh memory element and the second node, the second node being coupled to a first side of both the sixth and eighth memory elements;
a tenth transistor coupled between a second side of the sixth memory element and the second read bit line; and
an eleventh transistor coupled between a second side of the eighth memory element and the second read bit line.

14. The random access memory architecture of claim 8 wherein the first, second, third, and fourth memory elements are each individually capable of having a voltage applied thereacross.

15. The random access memory architecture of claim 8 wherein the first, second, third, and fourth memory elements are each individually capable of having a voltage applied thereacross for setting the state thereof.

16. The random access memory architecture of claim 9 further comprising:
 a sense amplifier coupled to the first and second read bitlines wherein the sense amplifier is configured to read and set the state of each memory element.

17. The random access memory architecture of claim 7 wherein the first series connected pair of memory elements comprises first and second memory elements and the second series connected pair of memory elements comprises third and fourth memory elements, each of the first, second, third, and fourth memory elements having a first and second terminal, the random access memory architecture further comprises:
 a current conductor;
 a first read bit line;
 a second read bit line;
 a third read bit line;
 a first transistor coupled between the current conductor and the first terminal of the first memory element;
 a second transistor coupled between the current conductor and the first terminal of the third memory element;
 a third transistor coupled between the second terminal of the first memory element and the first read bit line;
 a fourth transistor coupled between the second terminal of the third memory element and the second read bit line;
 a fifth transistor coupled between the first read bitline and the first terminal of the second memory element;
 a sixth transistor coupled between the second read bitline and the first terminal of the fourth memory element;
 a seventh transistor coupled between the second terminal of the second memory element and the third read bit line; and
 an eighth transistor coupled between the second terminal of the fourth memory element and the third read bit line.

18. The random access memory architecture of claim 7 wherein the first series connected pair of memory elements comprise first and second magnetic tunnel junctions and the second series connected pair of memory elements comprise third and fourth magnetic tunnel junctions.

19. A random access memory architecture comprising:
 an array comprising at least one data column of memory cells coupled to have information stored within at least one memory cell, each memory cell including at least one non-volatile memory element programmable to one of the first state of resistance and the second state of resistance;
 a midpoint reference coupled between a first node and a second node and having a resistance between that of the first resistance state and the resistance of the second resistance state, comprising:
  a first memory element coupled to the first node and having a programmable state comprising one of the first resistance state and the second resistance state;
  a second memory element coupled to the second node and having a programmable state comprising one of the first resistance state and the second resistance state coupled to the first memory cell wherein the first and second memory elements comprise a first series connected pair of elements:
  a third memory element coupled to the first node and having a programmable state comprising one of the first resistance state and the second resistance state; and
  a fourth memory element coupled to the second node and having a programmable state comprising one of the first resistance state and the second resistance state coupled to the third memory element, wherein the third and fourth memory elements comprise a second series connected pair of memory elements; and
  circuitry selectively coupled to either the first or second memory element in order to sense whether the coupled first or second memory element is in the first or second resistance state, and to either the third or fourth memory element in order to sense whether the coupled third or fourth memory element is in the first or second resistance state;
 a sense amplifier coupled to the array of memory cells; and
 a voltage bias portion coupled to the sense amplifier, the voltage bias portion including the first, second, third, and fourth memory elements.

20. The random access memory architecture of claim 19 wherein the voltage bias circuit comprises:
 a first transistor of a first conductivity type having a first current electrode coupled to a first node, a second current electrode coupled to a second node, and a control electrode coupled to a reference voltage;
 a second transistor of a second conductivity type having a first current electrode coupled to the second node; a second current electrode coupled to a drain voltage, and a control electrode coupled to the second node;
 a third transistor of a first conductivity type having a first current electrode coupled to the first node, a second current electrode coupled to the second node, and a control electrode coupled to the reference voltage; and
 a fourth transistor of the second conductivity type having a first current electrode coupled to the second node, a second current electrode coupled to a drain voltage, and a control electrode coupled to the second node;
 wherein the first and second memory elements are coupled between the first node and a voltage source.

* * * * *